(12) United States Patent
Youngblood et al.

(10) Patent No.: US 9,405,196 B2
(45) Date of Patent: *Aug. 2, 2016

(54) METHOD FOR PREPARING ELECTRICALLY-CONDUCTIVE SILVER IMAGES

(71) Applicant: Eastman Kodak Company, Rochester, NY (US)

(72) Inventors: Michael Phillip Youngblood, Rochester, NY (US); Kenneth James Lushington, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/749,763

(22) Filed: Jun. 25, 2015

(65) Prior Publication Data

US 2015/0338738 A1   Nov. 26, 2015

Related U.S. Application Data

(63) Continuation-in-part of application No. 14/281,925, filed on May 20, 2014, now Pat. No. 9,235,130.

(51) Int. Cl.
*G03F 7/30* (2006.01)
*G03F 7/26* (2006.01)
*G03C 1/005* (2006.01)

(52) U.S. Cl.
CPC . *G03F 7/26* (2013.01); *G03C 1/005* (2013.01)

(58) Field of Classification Search
CPC .................................. G03F 7/26; G03C 1/005
USPC ......................................................... 430/325
See application file for complete search history.

(56) References Cited

U.S. PATENT DOCUMENTS

| | | |
|---|---|---|
| 8,012,676 B2 | 9/2011 | Yoshiki et al. |
| 2011/0007011 A1 | 1/2011 | Mozdzyn |
| 2011/0102370 A1 | 5/2011 | Kono et al. |
| 2011/0289771 A1 | 12/2011 | Kuriki |
| 2011/0308846 A1 | 12/2011 | Ichiki |
| 2012/0327569 A1 | 12/2012 | Park et al. |
| 2013/0222325 A1 | 8/2013 | Cok |
| 2013/0222326 A1 | 8/2013 | Cok |
| 2014/0041924 A1 | 2/2014 | Cok |
| 2014/0085251 A1 | 3/2014 | Cok |
| 2015/0338740 A1* | 11/2015 | Youngblood ............. G03F 7/32 430/9 |

* cited by examiner

*Primary Examiner* — Geraldina Visconti
(74) *Attorney, Agent, or Firm* — J. Lanny Tucker

(57) ABSTRACT

Electrically-conductive articles are prepared to have electrically-conductive silver metal electrode grids on one or both supporting sides of a transparent substrate. Such articles are prepared by imagewise exposing conductive film element precursors having photosensitive silver halide layers, followed by development, fixing, and conductivity enhancement. The resulting silver image(s) can be treated with a stabilizing solution containing 0.5-50 mmol/l of specific stabilizing agents.

16 Claims, No Drawings

METHOD FOR PREPARING ELECTRICALLY-CONDUCTIVE SILVER IMAGES

CROSS-REFERENCE TO RELATED APPLICATIONS

This application is a continuation-in-part of and commonly assigned U.S. patent application Ser. No. 14/281,925 (filed May 20, 2014 by Lushington, Sutton, and Cok and issued as U.S. Pat. No. 9,235,130 on Jan. 12, 2016), the disclosure of which is incorporated herein by reference in its entirety.

Reference is also made to the following copending and commonly assigned patent applications, the disclosures of all of which are incorporated herein by reference:

U.S. Ser. No. 14/166,910 (filed Jan. 29, 2014 by Lushington, and granted as U.S. Pat. No. 9,247,640 on Jan. 26, 2016);

U.S. Ser. No. 14/281,923 (filed on May 20, 2014 by Lushington, Cok, and Sutton, U.S. Publication No. 2015/0338969, Nov. 26, 2015);

U.S. Ser. No. 14/281,953 (filed on May 20, 2014 by Cok, Sutton, and Lushington, U.S. Publication No. 2015/0338970, Nov. 26, 2015);

U.S. Ser. No. 14/281,968 (filed on May 20, 2014 by Youngblood and Lowe, U.S. Publication No. 2015/0338740, Nov. 26, 2015);

U.S. Ser. No. 14/281,977 (filed on May 20, 2014 by Youngblood and Lowe, U.S. Publication No. 2015/0338741, Nov. 26, 2015, now abandoned); and U.S. Ser. No. 14/281,984 (filed on May 20, 2014 by Youngblood and Lowe, U.S. Publication No. 2015/0338742, Nov. 26, 20915).

FIELD OF THE INVENTION

This invention relates to a method for preparing transparent electrically-conductive articles from conductive film element precursors that have a photosensitive silver halide emulsion layer on one or both sides of a transparent substrate. The electrically-conductive articles containing electrically-conductive silver images are prepared using a unique series of chemical processing features including one or more development steps, fixing, conductivity enhancement, and stabilization using a unique stabilizing solution.

BACKGROUND OF THE INVENTION

Rapid advances are occurring in various electronic devices especially display devices that are used for various communicational, financial, and archival purposes. For such uses as touch screen panels, electrochromic devices, light-emitting diodes, field-effect transistors, and liquid-crystal displays, electrically-conductive films are essential and considerable efforts are being made in the industry to improve the properties of those electrically-conductive films and particularly to improve metal grid or line conductivity and to provide as much correspondence between mask design with resulting user metal patterns.

Electrically-conductive articles used in various electronic devices including touch screens in electronic, optical, sensory, and diagnostic devices including but not limited to telephones, computing devices, and other display devices have been designed to respond to touch by a human fingertip or mechanical stylus.

There is a particular need to provide touch screen displays and devices that contain improved electrically-conductive film elements. Currently, touch screen displays use Indium Tin Oxide (ITO) coatings to create arrays of capacitive areas used to distinguish multiple points of contacts. ITO coatings have significant disadvantages and efforts are being made to replace their use in various electronic devices.

Silver is an ideal conductor having an electrical conductivity 50 to 100 times greater than ITO and is being explored for this purpose. Unlike most metal oxides, silver oxide is still reasonably conductive and this reduces the problem of making reliable electrical connections. Silver is used in many commercial applications and is available from numerous sources. It is highly desirable to make electrically-conductive film elements using silver as the source of conductivity, but it requires considerable development to obtain optimal properties.

In known printed circuit board (PCB) and integrated circuit manufacture processes, the preferred means for mass manufacture is to print a circuit directly from a master article onto a suitable substrate, to create a copy of the circuit image on a suitable PCB photosensitive film, or to directly laser-write a master circuit image (or inverse pattern) onto the PCB photosensitive film. The imaged PCB photosensitive film is then used as a "mask" for imaging multiple copies onto one or more photoresist-coated substrates.

An essential feature of these methods is that the PCB photosensitive film and photoresist compositions are optimized in formulation and development so that the imaged copies are as faithful a representation of the master image as possible with respect to circuit dimensions and properties. This property is sometimes referred to as "fidelity" (or "correspondence") and the worse the fidelity, the poorer the performance of the resulting copies. However, in mass production of these electrical circuits having designed patterns with very fine dimensional features, there are a number of compositional and operational (for example, chemical processing) conditions that naturally work against fidelity, or making faithful reproductions of the master circuit image.

This is particularly true when silver halide is used for making the multiple copies of a master circuit pattern intended for use as transparent conductive patterns. For example, development of exposed silver halide using strong developers intended to achieve high conductivity, and the high level of silver in the photosensitive coatings for the same purpose, can lead to very large dimensional differences between the master circuit image and copies made thereof using various mask elements. In addition, this lack of faithful reproduction of the dimensions in the master circuit image is strongly influenced by the dimensional scale of the circuitry images that are being reproduced. Thus, smaller features in the master circuit image become larger and the larger features in the master circuit image become smaller. These objectionable changes in the features from "master to copy" result in reduced conductivity in the resulting copy patterns and overall poorer performance in the electrical devices in which they are incorporated.

It requires considerable research and development effort to determine the various causes of the lack of fidelity between master circuit image and copies, especially when photosensitive silver halide is used for this process. There are numerous publications relating to using photosensitive silver halide in this manner, but none that addresses the noted problem.

For example, U.S. Patent Application Publication 2011/0308846 (Ichiki) describes the preparation of electrically-conductive films formed by reducing a silver halide image in electrically-conductive networks with silver wire sizes less than 10 µm, which electrically-conductive films can be used to form touch panels in displays. In addition, improvements have been proposed for providing conductive patterns using photosensitive silver salt compositions such as silver halide emulsions as described for example in U.S. Pat. No. 8,012,676 (Yoshiki et al.).

Recently designed improved electrically-conductive articles are prepared from photosensitive silver halide precursor articles as described for example in copending and commonly assigned U.S. Ser. No. 14/166,910 (noted above).

Electrically-conductive silver articles have been described for use in touch screen panels that have electrically-conductive silver grid patterns on both sides of a transparent substrate, for example as in U.S. Patent Application Publications 2011/0289771 (Kuriki) and 2011/0308846 (Ichiki).

U.S. Patent Application Publication 2014/0367620 (Gogle et al.) describes methods for enhancing the electrical conductivity of silver images provided in photosensitive silver halide elements using various post-development and fixing treatments.

While these methods provide an important advance in the art, there is a need for further improvements to maintain desired electrical conductivity.

SUMMARY OF THE INVENTION

The present invention provides a method for providing a first electrically-conductive silver image, the method comprising, in order:

imagewise exposing a conductive film element precursor that comprises a transparent substrate comprising a first supporting side and an opposing second supporting side and a photosensitive silver halide emulsion layer on the first supporting side of the substrate, to radiation to provide a first latent silver image in the photosensitive silver halide emulsion layer on the first supporting side of the substrate, developing the first latent silver image on at least the first supporting side of the substrate to provide a first silver image corresponding to the first latent silver image on the first supporting side of the substrate, using a black-and-white developing solution, fixing to remove silver halide remaining in the photosensitive silver halide emulsion layer on the first supporting side of the substrate, treating the first silver image on the first supporting side of the substrate to enhance silver conductivity of the first silver image, and treating the first silver image with a stabilizing solution comprising at least 0.5 mmol/l and up to and including 50 mmol/l of a heterocyclic thiol, a benzotriazole, a tetraazoindene, or a purine derivative as a stabilizing agent, to provide an electrically-conductive silver image on the first supporting side of the substrate.

In some embodiments, the method of this invention can also be used to provide a second electrically-conductive silver image on the opposing second supporting side of the substrate that exhibits at least 80% integrated transmittance, wherein the conductive film element precursor further comprises a photosensitive silver halide emulsion layer disposed on the opposing second supporting side of the substrate, and the method further comprises:

imagewise exposing the photosensitive silver halide emulsion layer on the opposing second supporting side of the substrate to radiation to provide a second latent silver image in the photosensitive silver halide emulsion layer on the opposing second supporting side of the substrate, developing the second latent silver image on the opposing second supporting side to provide a second silver image corresponding to the second latent silver image on the opposing second supporting side of the substrate, using a black-and-white developing solution, fixing to remove silver halide remaining in the second photosensitive silver halide emulsion layer on the opposing second supporting side of the substrate, treating the second silver image on the opposing second supporting side of the substrate to enhance silver conductivity of the second silver image, and treating the first silver image with a stabilizing solution comprising at least 0.5 mmol/l and up to and including 50 mmol/l of a heterocyclic thiol, a benzotriazole, a tetranzoindene, or a purine derivative as a stabilizing agent, to provide a second electrically-conductive silver image on the opposing second supporting side of the substrate.

Thus, the method of the present invention provides an electrically-conductive article that has improved properties. The present invention includes the noted stabilizing step for treatment with specific stabilizing agents.

DETAILED DESCRIPTION OF THE INVENTION

The following discussion is directed to various embodiments of the present invention and while some embodiments can be more desirable for specific uses, the disclosed embodiments should not be interpreted or otherwise considered to be limiting the scope of the present invention, as claimed below. Thus, one skilled in the art should understand that the following disclosure has broader application than is explicitly described and the discussion or illustration of an embodiment is not intended to limit the scope of the present invention.

DEFINITIONS

As used herein to define various components and structures of the conductive film element precursors including photosensitive silver halide emulsion layers and processing solutions, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, solution, or the % of the dry weight of a layer. Unless otherwise indicated, the percentages can be the same for either a dry layer or pattern, or for the total solids of the formulation or composition used to make that layer or pattern.

Unless otherwise indicated, a "conductive film element precursor" and "precursor" are meant to be the same thing and to refer to an article used in the practice of the method of this invention to provide an electrically-conductive film element (or electrically-conductive article). Such precursors therefore comprise a "silver precursor material" (such as a silver halide) that can be converted to conductive silver metal particles (for example by reduction). Much of the discussion about the precursors is equally applicable to the conductive articles as most of the components and structure are not changed when silver cations are converted to silver metal particles. Thus, unless otherwise indicated, the discussion of transparent substrates, hydrophilic binders and colloids, and other addenda in photosensitive silver halide emulsion layers, any hydrophilic overcoats, and any other components or layers for the precursors are also intended to describe the components of the resulting electrically-conductive articles.

Unless otherwise indicated, the terms "electrically-conductive film element" and "electrically-conductive article" are intended to mean the same thing. They refer to the materials containing the electrically-conductive silver metal electrode grids and electrically-conductive silver connector wire patterns disposed on either or both supporting sides of a suitable transparent substrate. Other components of the electrically-conductive article are described below.

The term "first" refers to the layers on one (first) supporting side of the transparent substrate and the term "second" refers to the layers on the opposing (opposite) second supporting side of the transparent substrate. Each supporting side of the transparent substrate can be equally useful and the term "first" does not necessarily mean that one side is the primary or better supporting side of the precursor or electrically-conductive article.

The terms "duplex" and "two-sided" are used herein in reference to precursors and electrically-conductive articles having the described layers and electrically-conductive silver metal electrode grids and electrically-conductive silver connector wire patterns on both supporting sides of the transparent substrate. Unless otherwise indicated herein, the relationships and compositions of the various layers can be the same or different on both supporting sides of the transparent substrate.

ESD refers to "equivalent spherical diameter" and is a term used in the photographic art to define the size of particles such as silver halide grains. Particle size of silver halide grains as expressed in grain ESD can be readily determined using disc centrifuge instrumentation.

Unless otherwise indicated, "black-and-white" refers to silver-forming black-and-white materials and formulations, and not chromogenic black-and-white materials and formulations.

In most embodiments, the conductive film element precursors and the resulting electrically-conductive articles, including the transparent substrate and all accompanying layers, electrically-conductive silver metal electrode grids, and transparent regions on one or both supporting sides, are considered transparent meaning that its integrated transmittance over the noted visible region of the electromagnetic spectrum (for example from 410 nm to 700 nm) is 70% or more, or more likely at least 80% or even 90% or more, as measured for example using a spectrophotometer and known techniques. Thus, the touch regions in the resulting electrically-conductive articles will have this high integrated transmittance. However, the electrode connector regions containing the electrically-conductive silver connector wire patterns are generally much less transparent than the rest of the electrically-conductive articles and generally have an integrated transmittance of less than 68%, or less than 50%, or even less than 40% using the same equipment and procedures noted above.

Alternatively, the integrated transmittance can be associated with the calculated percentage of the transparent substrate area that is not covered by either the electrically-conductive silver metal electrode grid in the touch region or by the electrically-connected silver connector wire pattern in the electrode connector region.

In defining various dimensions of the silver main wires and silver micro-wires provided in the conductive articles, each dimension "average" is determined from at least 5 measurements of the specific dimension using appropriate measurement techniques and equipment that would be known to one skilled in the art.

Unless otherwise indicated, the terms "electrode connector regions," "BUS lines," and "BUS regions" mean the same thing.

Uses

The conductive film element precursors described herein can be used to form electrically-conductive articles that have various uses. For example, the electrically-conductive articles can be used as devices themselves or they can be used as components in devices having a variety of applications including but not limited to, electronic, optical, sensory, and diagnostic uses. In particular, it is desired to use the conductive film element precursors to provide highly electrically-conductive silver metal electrode grids and electrically-conductive silver metal connector wire patterns comprising silver metal lines having suitable height, width, and conductivity for use in touch screen displays or as components of touch-screen devices. Such electronic and optical devices and components include but are not limited to, radio frequency tags (RFID), sensors, touch-screen displays, and memory and back-panels for displays.

Conductive Film Element Precursors

The conductive film element precursors used in the practice of this invention comprise photosensitive silver halide(s) but they do not generally contain chemistry sufficient to provide color photographic images. Thus, these "precursors" are considered to be black-and-white photosensitive materials forming metallic silver images following exposure and development, and are non-color image-forming.

The precursors and the resulting electrically-conductive articles, including the transparent substrate and all accompanying layers on one or both supporting sides, are considered transparent in the touch regions in which the electrically-conductive silver metal electrode grids are formed, and other transparent regions outside the electrically-conductive silver metal electrode grids and the electrically-conductive silver connector wire pattern, meaning that the integrated transmittance over the visible region of the electromagnetic spectrum (for example from 410 nm to 700 nm) through the entire electrically-conductive article in these touch regions and other transparent regions is 70% or more, or more likely at least 80%, or even 90% or more. Integrated transmittance is measured as described above.

However, the electrode connector regions of the processed photosensitive silver halide emulsion layers that are used to provide the electrically-conductive silver connector wire patterns are less transparent due to the higher coverage of silver metal formed in those electrode connector regions. For example, such electrode connector regions comprised of electrically-conductive silver connector wire patterns generally have an integrated transmittance of less than 68%, or less than 50%, or even less than 40%.

The precursors can be formed by providing a non-color (that is, silver image-forming black-and-white) photosensitive silver halide emulsion layer on one or both supporting sides (or planar sides as opposed to non-supporting edges) of a suitable transparent substrate in a suitable manner. Each photosensitive layer comprises a silver halide, or a mixture of silver halides, at a suitable silver coverage, such as a total silver coverage of at least 2500 mg Ag/m$^2$, or at least 3500 mg Ag/m$^2$ but usually less than 5000 mg Ag/m$^2$, for example up to and including 4950 mg Ag/m$^2$. However, higher amounts of silver coverage can be used as would be known in the art. Thus, each photosensitive layer has sufficient silver halide intrinsic or added spectral sensitization to be photosensitive to preselected imaging irradiation (described below). The photosensitive layers can be the same or different in composition and spectral sensitization on the opposing supporting sides of the transparent substrate.

The one or more silver halides are dispersed within one or more suitable hydrophilic binders or colloids as described below.

Such precursors are therefore treated (or processed) in such a manner as to convert the silver cations into silver metal particles (such as by reduction), and this treated precursor can then become an electrically-conductive article according to the present invention.

The precursors can have one essential layer on each supporting side of the transparent substrate, which essential layer is a photosensitive silver halide emulsion layer. This essential layer can be disposed on only one supporting side of the transparent substrate, but in many duplex embodiments, it is disposed on both first supporting and opposing second supporting sides of the transparent substrate. Optional layers, such as hydrophilic overcoats and filter dye layers can also be present on either or both supporting sides and are described below but they are not essential to achieve the desired advantages of the present invention.

Transparent Substrates:

The choice of a transparent substrate generally depends upon the intended utility of the resulting electrically-conductive article such that the conductive article can be fabricated in a suitable manner for a predetermined device. The transparent substrate can be rigid or flexible, and generally has an integrated transmittance of at least 80% and generally at least 95% over the visible region of the electromagnetic spectrum (for example at least 410 nm and up to and including 700 nm). Integrated transmittance can be determined using a spectrophotometer and known procedures as described above.

Suitable transparent substrates include but are not limited to, glass, glass-reinforced epoxy laminates, cellulose triacetate, acrylic esters, polycarbonates, adhesive-coated polymer transparent substrates, polyester films, and transparent composite materials. Suitable transparent polymers for use as transparent polymer substrates include but are not limited to, polyethylene and other polyolefins, polyesters such as polyethylene terephthalate (PET), polyethylene naphthalate (PEN), and particularly a polyester having an integrated transmittance of at least 80%, poly-1,4-cyclohexanedimethylene terephthalate, poly(butylene terephthalate), and copolymers thereof, polypropylenes, polyvinyl acetates, polyurethanes, polyamides, polyimides, polysulfones, polycarbonates, and mixtures thereof. Other useful transparent substrates can be composed of cellulose derivatives such as a cellulose ester, cellulose triacetate, cellulose diacetate, cellulose acetate propionate, cellulose acetate butyrate, polyacrylates, polyether imides, and mixtures thereof.

Transparent polymeric substrates can also comprise two or more layers of the same or different polymeric composition so that the composite transparent substrate (or laminate) has the same or different layer refractive properties. The transparent substrate can be treated on either or both supporting sides to improve adhesion of a photosensitive silver halide emulsion or underlying layer. For example, the transparent substrate can be coated with a polymer adhesive layer, can be chemically treated, or subjected to a corona treatment, on one or both supporting sides.

Commercially available oriented and non-oriented transparent polymer films, such as biaxially-oriented polypropylene or polyester, can be used. Such transparent substrates can contain pigments, air voids or foam voids as long as desired integrated transmittance is obtained. The transparent substrate can also comprise microporous materials such as polyethylene polymer-containing material sold by PPG Industries, Inc., Pittsburgh, Pa. under the trade name of Teslin®, Tyvek® synthetic paper (DuPont Corp.). The transparent substrate also can be voided, which means it contains voids formed as interstitial voids using added solid and liquid materials, or "voids" containing a gas. Some commercial microvoided products are commercially available as 350K18 from ExxonMobil and KTS-107 (from HSI, South Korea).

Biaxially-oriented sheets, while described as having at least one layer, can also be provided with additional layers that can serve to change the optical or other properties of the biaxially-oriented sheet. Such layers might contain tints, antistatic or conductive materials, or slip agents. The biaxially-oriented extrusion can be carried out with as many as 10 layers if desired, made with layers of the same polymeric material, or with layers having different polymeric composition.

Flexible transparent substrates for the manufacture of flexible electronic devices or touch screen components facilitate rapid roll-to-roll manufacture. Estar® poly(ethylene terephthalate) films and cellulose triacetate films are particularly useful materials for making flexible transparent substrates.

The transparent substrate used in the precursors can have a thickness of at least 20 μm and up to and including 300 μm or typically at least 75 μm and up to and including 200 μm. Antioxidants, brightening agents, antistatic or conductive agents, plasticizers, and other known additives can be incorporated into the transparent substrate, if desired, in amounts that would be readily apparent to one skilled in the art as long as desired integrated transmittance is preserved.

Photosensitive Silver Halide Emulsion Layers:

The essential silver halide(s) in these layers comprise silver cations of one or more silver halides that can be converted into silver metal particles according to desired patterns upon imagewise exposure of each photosensitive silver halide emulsion layer. Such exposure is generally achieved by imaging through a mask element that is designed with predetermined patterns for both an electrically-conductive silver metal electrode grid and an electrically-conductive silver connector wire pattern. The latent image(s) provided by this exposure can then be developed into desired silver metal image(s) using silver development procedures and chemistry (described below). The silver halide (or combination of silver halides) is photosensitive, meaning that radiation from UV to visible light (for example, of at least 200 nm and up to and including 750 nm radiation) is generally used to convert silver cations to silver metal particles in a latent image. In some embodiments, the silver halide is present in combination with a thermally-sensitive silver salt (such as silver behenate) and the photosensitive silver halide emulsion layer can be both photosensitive and thermally sensitive (that is, sensitive to thermal imaging energy such as infrared radiation).

The useful photosensitive silver halides can be, for example, silver chloride, silver bromide, silver chlorobromoiodide, silver bromochloroiodide, silver chlorobromide, silver bromochloride, or silver bromoiodide that are prepared as individual compositions (or emulsions). The various halides are listed in the silver halide name in descending order of halide amount. In addition, individual silver halide emulsions can be prepared and mixed to form a mixture of silver halide emulsions that are used on the same or different supporting sides of the transparent substrate. In general, the useful silver halides comprise up to and including 100 mol % of chloride or up to and including 100 mol % of bromide, and up to and including 5 mol % iodide, all based on total silver. These silver halides are generally known as "high chloride" or "high bromide" silver halides and can be used to form "high chloride," or "high bromide" emulsions, respectively.

The silver halide grains used in each photosensitive silver halide emulsion layer generally have an ESD of at least 30 nm and up to and including 300 nm, or more likely at least 50 nm and up to and including 200 nm.

The coverage of total silver in each photosensitive silver halide emulsion layer is desirably at least 2500 mg Ag/m$^2$ and typically at least 3500 mg Ag/m$^2$ and can be less than 5000 mg Ag/m$^2$, although higher amounts can be used.

The dry thickness of each photosensitive silver halide emulsion layer is generally at least 0.5 μm and up to and including 12 μm, and particularly at least 0.5 μm and up to and including 7 μm.

The final dry photosensitive silver halide emulsion layer can be made up of one or more individually coated photosensitive silver halide emulsion sub-layers that can be applied using the same or different silver halide emulsion formulations. Each sub-layer can be composed of the same or different silver halide(s), hydrophilic binders or colloids, and addenda. The photosensitive silver halide emulsion sub-layers can have the same or different amount of silver content.

The photosensitive silver halide(s) used in the photosensitive silver halide emulsion layer on the first supporting side can be the same or different from the photosensitive silver halide(s) used in the opposing second supporting side photosensitive silver halide emulsion layer.

The photosensitive silver halide grains (and any addenda associated therewith as described below) are dispersed (generally uniformly) in one or more suitable hydrophilic binders or colloids to form a hydrophilic silver halide emulsion. Examples of such hydrophilic binders or colloids include but are not limited to, gelatin and gelatin derivatives, polyvinyl alcohol (PVA), poly(vinyl pyrrolidone) (PVP), casein, and mixtures thereof. Suitable hydrophilic colloids and vinyl polymers and copolymers are also described in Section IX of *Research Disclosure* Item 36544, September 1994 that is published by Kenneth Mason Publications, Emsworth, Hants, PO10 7DQ, UK. A particularly useful hydrophilic colloid is gelatin or a gelatin derivative of which several are known in the art.

The amount of hydrophilic binder or colloid in each photosensitive silver halide emulsion layer can be adapted to the particular dry thickness that is desired as well as the amount of silver halide that is incorporated. It can also be adapted to meet desired dispersibility, swelling, and layer adhesion to the transparent substrate. The amount of hydrophilic binder or colloid is generally controlled to maximize the conductivity of the resulting silver metal particles in the conductive articles.

In general, the one or more hydrophilic binders or colloids are present in an amount of at least 10 weight % and up to and including 95 weight %, or more likely at least 10 weight % and up to and including 50 weight %, all based on the total solids in the dry photosensitive silver halide emulsion layer.

Some useful photosensitive silver halide emulsion layer composition have a relatively high silver ion/hydrophilic binder (for example, gelatin) weight (or volume) ratio. For example, a particularly useful weight ratio of silver ions (and eventually silver metal) to hydrophilic binder or colloid such as gelatin (or its derivative) is at least 0.1:1, or even at least 1.5:1 and up to and including 10:1. A particularly useful weight ratio of silver ions to the hydrophilic binder or colloid can be at least 2:1 and up to and including 5:1. Other weight ratios can be readily adapted for a particular use and dry layer thickness. Particularly useful silver ion/hydrophilic binder (gelatin) volume ratio is less than 0.5:1 or even less than 0.35:1.

The hydrophilic binder or colloid can be used in combination with one or more hardeners designed to harden the particular hydrophilic binder such as gelatin. Particularly useful hardeners for gelatin and gelatin derivatives include but are not limited to, non-polymeric vinyl-sulfones such as bis(vinyl-sulfonyl)methane (BVSM), bis(vinyl-sulfonyl methyl) ether (BVSME), and 1,2-bis(vinyl-sulfonyl acetamide) ethane (BVSME). Mixtures of hardeners can be used if desired. The hardeners can be incorporated into each photosensitive silver halide emulsion layer in any suitable amount that would be readily apparent to one skilled in the art.

In general, each photosensitive silver halide emulsion layer can be hardened so that it has swell ratio of at least 150% but less than 300% as determined by optical microscopy of element cross-sections, and the swell ratio can be provided by use of appropriate amounts of hardeners within the photosensitive silver halide emulsion layer, or hardeners within various processing solutions (described below).

If desired, the useful silver halides described above can be sensitized to any suitable wavelength of exposing radiation. Organic sensitizing dyes can be used, but it can be advantageous to sensitize the silver salt to the UV portion of the electromagnetic spectrum without using visible light sensitizing dyes to avoid unwanted dye stains if the electrically-conductive article containing the silver metal particles is intended to be transparent. Alternatively, the silver halides can be used without spectral sensitization beyond their intrinsic spectral sensitivities.

Non-limiting examples of addenda that can be included with the silver halides, including chemical and spectral sensitizers, filter dyes, organic solvents, thickeners, dopants, emulsifiers, surfactants, stabilizers, hardeners, and antifoggants are described in *Research Disclosure* Item 36544, September 1994 and the many publications identified therein. Such materials are well known in the art and it would not be difficult for a skilled artisan to formulate or use such components for purposes described herein. Some useful silver salt emulsions are described, for example in U.S. Pat. No. 7,351, 523 (Grzeskowiak), U.S. Pat. Nos. 5,589,318, and 5,512,415 (both to Dale et al.).

Useful silver halide emulsions containing silver halide grains that can be reduced to silver metal particles can be prepared by any suitable method of grain growth, for example, by using a balanced double run of silver nitrate and salt solutions using a feedback system designed to maintain the silver ion concentration in the growth reactor. Known dopants can be introduced uniformly from start to finish of precipitation or can be structured into regions or bands within the silver halide grains. Useful dopants include but are not limited to, osmium dopants, ruthenium dopants, iron dopants, rhodium dopants, iridium dopants, and cyanoruthenate dopants. A combination of osmium and iridium dopants such as a combination of osmium nitrosyl pentachloride and iridium dopant is useful. Such complexes can be alternatively utilized as grain surface modifiers in the manner described in U.S. Pat. No. 5,385,817 (Bell). Chemical sensitization can be carried out by any of the known silver halide chemical sensitization methods, for example using thiosulfate or another labile sulfur compound, alone or in combination with gold complexes.

Useful silver halide grains can be rounded cubic, octahedral, rounded octahedral, polymorphic, tabular, or thin tabular emulsion grains. Such silver halide grains can be regular untwinned, regular twinned, or irregular twinned with cubic or octahedral faces. In one embodiment, the silver halide grains can be rounded cubic having an ESD of less than 0.5 μm and at least 0.05 μm.

Antifoggants and stabilizers can be added to give the silver halide emulsion the desired sensitivity, if appropriate. Useful antifoggants include, for example, azaindenes such as tetraazaindenes, tetrazoles, benzotriazoles, imidazoles and benzimidazoles. Specific antifoggants that can be used include 6-methyl-1,3,3a,7-tetraazaindene, 1-(3-acetamidophenyl)-5-mercaptotetrazole, 6-nitrobenzimidazole, 2-methylbenzimidazole, and benzotriazole, individually or in combination.

The essential silver halide grains and hydrophilic binders or colloids, and optional addenda can be formulated and coated as a silver halide emulsion using suitable emulsion solvents including water and water-miscible organic solvents. For example, useful solvents for making the silver halide emulsion or coating formulation can be water, an alcohol such as methanol, a ketone such as acetone, an amide such as formamide, a sulfoxide such as dimethyl sulfoxide, an ester such as ethyl acetate, liquid or low molecular weight poly (vinyl alcohol), or an ether, or combinations of these solvents. The amount of one or more solvents used to prepare the silver halide emulsions can be at least 30 weight % and up to and including 50 weight % of the total formulation weight. Such coating formulations can be prepared using any of the photographic emulsion making procedures that are known in the art.

Hydrophilic Overcoats

While the photosensitive silver halide emulsion layer, on either or both supporting sides of the transparent substrate, can be the outermost layer in the precursor, in many embodiments, there can be a hydrophilic overcoat disposed over each photosensitive silver halide emulsion layer. This hydrophilic overcoat can be the outermost layer in the precursor (that is, there are no layers purposely placed over it on either or both supporting sides of the transparent substrate). If both supporting sides of the transparent substrate comprise a photosensitive silver halide layer, then a hydrophilic overcoat can be present on both supporting sides of the transparent substrate. Thus, a first hydrophilic overcoat is disposed over the first photosensitive silver halide emulsion layer, and a second hydrophilic overcoat is disposed over a second photosensitive silver halide emulsion layer on the opposing second supporting side of the transparent substrate. In most embodiments, each hydrophilic overcoat is directly disposed on each photosensitive silver halide emulsion layer, meaning that there are no intervening layers on the supporting sides of the transparent substrate. The chemical compositions and dry thickness of these hydrophilic overcoats can be the same or different, but in most embodiments they have essentially the same chemical composition and dry thickness on both supporting sides of the transparent substrate.

In some embodiments, each hydrophilic overcoat (first or second, or both) comprises one or more silver halides in the same or different amount so as to provide silver metal particles after exposure and processing, in an amount of at least 5 mg Ag/m$^2$ and up to and including 150 mg Ag/m$^2$, or at least 5 mg Ag/m$^2$ and up to and including 75 mg Ag/m$^2$. When present, the one or more silver halides in each hydrophilic overcoat can have a grain ESD of at least 100 nm and up to and including 1000 nm, or at least 150 nm and up to and including 600 nm. In some embodiments, the one or more silver halides in each hydrophilic overcoat have a grain ESD that is larger than the grain ESD of the silver halide in the non-color hydrophilic photosensitive layer over which it is disposed. In various embodiments, the silver halide(s) in each hydrophilic overcoat comprises up to 100 mol % bromide or up to 100 mol % chloride, and up to and including 3 mol % iodide, all molar amounts based on total silver content. In other embodiments, the silver halide(s) in each hydrophilic overcoat comprises more chloride than the silver halide in the non-color hydrophilic photosensitive layer over which it is disposed. This relationship can be the same or different on both supporting sides of the transparent substrate in the "duplex" conductive film element precursors.

When present, the silver halide is dispersed (generally uniformly) within one or more hydrophilic binders or colloids in each hydrophilic overcoat, which hydrophilic binders or colloids include those described above for the non-color hydrophilic photosensitive layers. In many embodiments, the same hydrophilic binders or colloids can be used in all of the layers of the precursor. However, different hydrophilic binders or colloids can be used in the various layers, and on either or both supporting sides of the transparent substrate. The amount of one or more hydrophilic binders or colloids in each hydrophilic overcoat is the same or different and generally at least 50 weight % and up to and including 100 weight %, or typically at least 75 weight % and up to and including 98 weight %, all based on total hydrophilic overcoat dry weight.

In some embodiments, the hydrophilic overcoat can further comprise one or more radiation absorbers such as UV radiation absorbers in an amount of at least 5 mg/m$^2$ and up to and including 100 mg/m$^2$. Such UV radiation absorbers can be "immobilized" meaning that they do not readily diffuse out of the hydrophilic overcoat.

The same hydrophilic binders or colloids are used if no silver halide is present, and in such embodiments, the hydrophilic binders or colloids can comprise up to and including 100 weight % of the total hydrophilic overcoat dry weight.

Each hydrophilic overcoat can also comprise one or more hardeners for a hydrophilic binder or colloid (such as gelatin or a gelatin derivative). Useful hardeners are described above.

The dry thickness of the each hydrophilic overcoat can be at least 100 nm and up to and including 800 nm or more particularly at least 300 nm and up to and including 500 nm. In embodiments containing silver halide, the grain ESD to dry thickness ratio in the hydrophilic overcoat can be from 0.25:1 to and including 1.75:1 or more likely from 0.5:1 to and including 1.25:1.

Additional Layers:

In addition to the layers and components described above on one or both supporting sides of the transparent substrate, the precursors and electrically-conductive articles can also include other layers that are not essential but can provide additional properties or benefits, including but not limited to radiation absorbing filter layers, adhesion layers, and other layers as are known in the black-and-white photographic art. The radiation absorbing filter layers can also be known as "antihalation" layers that can be located between the essential layers and each supporting side of the transparent substrate. For example, each supporting side can have a radiation absorbing filter layer disposed directly on it, and directly underneath the photosensitive silver halide emulsion layer. Such radiation absorbing filter layers can include one or more filter dyes that absorb in the UV, red, green, or blue regions of the electromagnetic spectrum, or any combination thereof, and can be on located between the transparent substrate and the photosensitive silver halide emulsion layer on each or both supporting sides of the transparent substrate.

The duplex electrically-conductive film element precursors used in the present invention can comprise on the opposing second supporting side of the transparent substrate, a second photosensitive silver halide emulsion layer and optionally, a second hydrophilic overcoat disposed over the second photosensitive silver halide emulsion layer. A radiation absorbing filter layer can be disposed between the opposing second supporting side of the transparent substrate and the second photosensitive silver halide emulsion layer, which radiation absorbing filter layer can be the same as or different from the radiation absorbing filter layer on the first supporting side of the transparent substrate. For example, such radiation absorbing filter layers can include one or more UV radiation absorbing compounds.

In many duplex electrically-conductive film element precursors, the second photosensitive silver halide emulsion layer and a second hydrophilic overcoat (if present) have the same composition as the first photosensitive silver halide emulsion layer and the first hydrophilic overcoat, respectively.

Preparing Conductive Film Element Precursors

The various layers are formulated using appropriate components and coating solvents and are applied to one or both supporting sides of a suitable transparent substrate (as described above) using known coating procedures including those commonly used in the photographic industry (for example, bead coating, blade coating, curtain coating, spray coating, and hopper coating). Each layer formulation can be applied to each supporting side of the transparent substrate in single-pass procedures or in simultaneous multi-layer coating procedures. Known drying techniques can be used to dry each of the applied formulations.

Making Electrically-Conductive Articles

The resulting conductive film element precursors can be used immediately for an intended purpose, or they can be stored in roll or sheet form for later use. For example, the precursors can be rolled up during manufacture and stored for use in a roll-to-roll imaging and processing process, and subsequently cut into desired sizes and shapes.

To imagewise expose a precursor, a suitable mask element or group of mask elements are designed with predetermined patterns for both electrically-conductive silver metal electrode grids and electrically-conductive silver connector wire patterns that are eventually formed in the electrically-conductive articles. The photosensitive silver halide emulsion layers in the precursors are generally designed to accommodate both touch regions having desired electrically-conductive silver metal electrode grids, and electrode connector regions that contain desired electrically-conductive silver connector wire patterns to provide designed circuitry. Both touch regions and electrode connector regions are formed in the same photosensitive silver halide emulsion layer on one or both supporting sides of the transparent substrate. The transparent regions outside of the electrically-conductive silver metal electrode grids and electrically-conductive silver connector wire patterns generally contain no silver metal particles.

Thus, one or both sides of a precursor can be designed to be exposed to suitable radiation to provide, in each photosensitive silver halide emulsion layer: (a) a latent electrically-conductive silver metal electrode grid, and (b) a latent electrically-conductive silver connector wire pattern that is different from the latent electrically-conductive silver metal electrode grid. Each side of the precursor can be imagewise exposed at the same time or they can be imagewise exposed at different times using different mask elements so the opposing latent images in all regions are different in design, size, surface area covered by the silver metal particles, or sheet resistivity. Opposing photosensitive silver halide emulsion layers can also be designed to have different wavelength sensitivity so that different imaging (exposing) radiation wavelengths can be used for exposure of opposing supporting sides.

Thus, photosensitive silver halides in photosensitive silver halide emulsion layers can be imagewise exposed to appropriate actinic radiation (UV to visible radiation) from a suitable source that is well known in the art such as a xenon lamp, mercury lamp, or other source of radiation of from 200 nm and up to and including 700 nm.

The exposed precursors can be processed using various aqueous-based processing solutions as described below to provide in each exposed photosensitive silver halide emulsion layer: (a) an electrically-conductive silver metal electrode grid from the latent electrically-conductive silver metal electrode grid, (b) an electrically-conductive silver connector wire pattern from the latent electrically-conductive silver connector wire pattern, and (c) transparent regions outside of both the electrically-conductive silver metal electrode grid and the electrically-conductive silver connector wire pattern.

The resulting electrically-conductive silver metal electrode grid is formed in the touch region generally has an integrated transmittance of at least 75% (for example, the electrically-conductive silver metal electrode grid covers 25% or less of the total touch region surface area). Moreover, the resulting electrically-conductive silver connector wire pattern formed in the electrode connector regions has an integrated transmittance of 68% or less (or 50% or less). Thus, the electrically-conductive silver connector wire pattern generally covers more than 42% of the total electrode connector region. Integrated transmittance is determined as described above. These amounts can be the same or different on opposing supporting sides of the transparent substrate.

Prebath solutions can also be used to treat the exposed silver salts prior to development. Such solutions can include one or more development inhibitors as described above for the developing solutions, and in the same or different amounts. Effective inhibitors include but are not limited to, benzotriazoles, heterocyclic thiones, and mercaptotetrazoles. The prebath temperature can be in a range as described for development. Prebath time depends upon the concentration and particular inhibitor, but it can range from at least 10 seconds and up to and including 4 minutes.

Processing the exposed silver halide in the latent images is generally accomplished firstly with one or more development steps during which silver ions in the silver halide latent images are reduced to silver metal (or silver particles). Such development steps are generally carried out using known aqueous developing solutions that are commonly used in silver metal image-forming black-and-white photography and typically include at least one solution physical development solution.

Numerous silver metal image-forming black-and-white developing solutions (identified also as "developers") are known that can develop the exposed (latent image containing) silver halides described above to form silver metal particles. One commercial silver metal image-forming black-and-white silver halide developer that is useful is Accumax® silver halide developer. Silver metal image-forming black-and-white developing solutions are generally aqueous solutions including one or more silver halide developing agents, of the same or different type, including but not limited to those described in *Research Disclosure* Item 17643 (December, 1978) Item 18716 (November, 1979), and Item 308119 (December, 1989) such as polyhydroxybenzenes (such as dihydroxybenzene, or in its form as hydroquinone, cathecol, pyrogallol, methylhydroquinone, and chlorohydroquinone), aminophenols such as p-methylaminophenol, p-aminophenol, and p-hydroxyphenylglycine, p-phenylenediamines, ascorbic acid and its derivatives, reductones, erythrobic acid and its derivatives, 3-pyrazolidones such as 1-phenyl-4,4-dimethyl-3-pyrazolidone, 1-phenyl-3-pyrazolidone, and 1-phenyl-4-methyl-4-hydroxymethyl-3-pyrazolidone, pyrazolone, pyrimidine, dithionite, and hydroxylamines. These developing agents can be used individually or in combinations thereof. One or more developing agents can be present in suitable amounts for example of at least 0.01 mol/l and up to and including 1 mol/l.

The black-and-white developing solutions can also include auxiliary silver developing agents that exhibit super-additive properties with a developing agent. Such auxiliary developing agents can include but are not limited to, p-aminophenols and substituted or unsubstituted phenidones, in suitable amounts such as at least 0.001 mo/l and up to and including 0.1 mol/l.

The concentration of the one or more auxiliary silver developing agents can be less than the concentration of the one or more developing agents as described above.

Useful black-and-white developing solutions can also include one or more silver complexing agents (or silver ligands) including but not limited to, sulfite, thiocyanate, thiosulfate, thiourea, thiosemicarbazide, tertiary phosphines, thioethers, amines, thiols, aminocarboxylates, triazolium thiolates, pyridines (including bipyridine), imidazoles, and aminophosphonates, in known amounts. For example, one or more alkali metal sulfites can be present in an amount of at least 0.1 mol/l and up to and including 1 mol/l.

The black-and-white developing solutions can also comprise one or more alkyl- or aryl-substituted or unsubstituted mercaptotetrazoles in suitable amounts for various purposes such as at least 0.25 mmol/l and up to and including 2.5 mmol/l. Useful mercaptotetrazoles include but are not limited to, alkyl-, aryl-, and heterocyclyl-substituted mercaptotetrazoles. Examples of such compounds include but are not limited to, 1-phenyl-5-mercaptotetrazole (PMT), 1-ethyl-5-mercaptotetrazole, 1-t-butyl-5-mercaptotetrazole, and 1-pyridinyl-5-mercaptotetrazoles.

Moreover, the black-and-white developing solution can also include one or more development inhibitors in suitable amounts. Useful development inhibitors include but are not limited to, substituted and unsubstituted benzotriazole compounds such as 5-methylbenzotriazole, imidazoles, benzimidazole thiones, benzothiazole thiones, benzoxazole thiones, and thiazoline thiones, all in the same or different amounts as described above for the mercaptotetrazoles.

Other addenda that can be present in the black-and-white developing solutions in known amounts include but are not limited to, metal chelating agents, preservatives (such as sulfites), antioxidants, small amounts of water-miscible organic solvents (such as benzyl alcohol and diethylene glycol), nucleators, as well as acids, bases (such as alkali hydroxides), and buffers (such as carbonate, borax, phosphates, and other basic salts) to establish a pH of at least 8 and generally of a pH of at least 9.5, or at least 11 and up to and including 14.

The black-and-white halide developing solution can be supplied at working strength or in concentrated form that is diluted prior to or during use up to 5 times with water.

Multiple development steps can be used if desired. For example, a black-and-white developing solution can provide initial development to form silver metal nuclei and then a solution physical developing solution can be used to provide "solution physical development" that improves conductivity of the resulting silver metal images.

A solution physical development step can be carried out using a solution physical developing solution having a pH of at least 8 and up to and including 13. This solution physical developing solution can comprise one or more primary developing agents chosen from one or more of hydroquinone or its derivatives or one or more ascorbic acid or derivatives thereof. The primary developing agents in the solution physical developing solution can be the same or different as the primary developing agents in the black-and-white developing solution described above.

The one or more primary developing agents in the solution physical developing solution can be present in a total amount of at least 0.01 mol/l and up to and including 1 mol/l.

In addition, the solution physical developing solution comprises one or more silver halide dissolution catalysts as essential components in an amount of at least 0.001 mol/l and up to and including 0.1 mol/l, or typically of at least 0.005 mol/l and up to and including 0.05 mol/l.

Useful silver halide dissolution catalysts include but are not limited to, alkali metal thiocyanate salts such as sodium thiocyanate and potassium thiocyanate, thioethers such as 3,6-dithia-1,8-octanediol, and heterocyclic thiones such as tetrahydro-4,6-dimethyl-1,3,5-triazine-2(1H)-thione, and tetrahydro-3-hydroxyethyl-1,3,5-triazine-2(1H)-thione. These compounds can readily complex with silver.

In some embodiments, the solution physical developing solution contains substantially no catalytic developing agents such as those compounds described above for the black-and-white developing solution. The term "substantially no" means that less than 0.001 mol/l or even less than 0.0001 mol/l of such compounds are purposely incorporated into or created in the solution.

The solution physical developing solution can further comprise one or more alkali metal sulfites include sodium sulfite, potassium sulfite, and mixtures thereof. The alkali metal sulfites can be present in the silver halide solution physical developing solution in a total amount of at least 0.2 mol/l and up to and including 3 mol/l when potassium sulfite or sodium sulfite is used or particularly when only potassium sulfite is used.

The solution physical developing solution can further include one or more polyaminopolycarboxylic acid salts that are capable of complexing with silver ion, including but not limited to, diethylenetriamine pentaacetic acid, pentasodium salt and other similar compounds known in the art. Such compounds can be useful particularly when a sulfite is not present. Such compounds can be present in an amount of at least 0.001 mol/l and up to and including 0.03 mol/l.

The solution physical developing solution can also include one or more metal ion complexing agents that can complex with silver, calcium, iron, magnesium, or other metal ions that can be present. Silver or calcium metal ion complexing agents can be particularly useful in a total amount of at least 0.001 mol/l.

Particularly useful solution physical developing solutions include but are not limited to, hydroquinone or a derivative thereof and sodium thiocyanate or potassium thiocyanate, and optionally a sulfite and calcium or silver metal ion complexing agent.

The physical solution developing solution can be provided at working strength or in a concentrated form that is suitably diluted prior to or during processing using known processing equipment and procedures. For example, the physical developing solution can be concentrated at least 4 times compared to a desired working strength concentration.

Useful development temperatures can range from at least 15° C. and up to and including 60° C. Useful development times can range from at least 10 seconds and up to and including 10 minutes but more likely up to and including 1 minute. The same time or temperature can be used for individual development steps and can be adapted to develop at least 90 mol % of the exposed silver halide in all latent silver halide images. If a prebath solution is not used, the development time can be extended appropriately. Any exposed silver halide(s) in a hydrophilic overcoat is also developed during the development step(s). Washing or rinsing can be carried out with water after or between any development steps.

After development of the exposed silver halide to silver metal, the undeveloped silver halide in all photosensitive silver halide emulsion layers is generally removed by treating the developed silver-containing article with a silver halide fixing solution. Silver halide fixing solutions are well known in the black-and-white photographic art and contain one or more compounds that complex the silver ion for removal from the layers. Thiosulfate salts are commonly used in silver halide fixing solutions. The silver halide fixing solution can optionally contain a hardening agent such as alum or chromealum. The developed film can be processed in a silver halide fixing solution immediately after development, or there can be an intervening stop bath or water wash or rinse, or both stop bath and water rinse. Fixing can be carried out at any suitable temperature and time such as at least 20° C. for at least 30 seconds.

Fixing then leaves the silver metal particles in the conductive silver metal electrode grid and electrically-conductive silver connector wire pattern in each formerly photosensitive silver halide emulsion layer. Fixing also removes any non-developed silver halide in any hydrophilic overcoat.

After fixing, the resulting intermediate article can be washed or rinsed in water that can optionally include surfactants or other materials to reduce water spot formation upon drying.

After fixing, the intermediate article can be further treated to further enhance the conductivity of the silver metal (or nuclei) on each supporting side of the transparent substrate. A variety of ways have been proposed to carry out this "conductivity enhancement" process. For example, U.S. Pat. No. 7,985,527 (Tokunaga) and U.S. Pat. No. 8,012,676 (Yoshiki et al.) describe conductivity enhancement treatments using hot water baths, water vapor, reducing agents, or halides.

It is also possible to enhance conductivity of the silver metal particles by one or more contacts (treatments) with a conductivity enhancing agent in a conductivity enhancement solution followed by washing and drying. Thus, each of these conductivity enhancement cycles can include: (a) treatment with a conductivity enhancing solution, (b), washing, and (c) drying; and each of these cycles can be carried out two or more times.

Useful conductivity enhancing agents include but are not limited to, sulfites, borane compounds, hydroquinones, p-phenylenediamines, and phosphites. For example, at least 0.5 weight % of an amine borane can be used in the practice of this invention. The treatment can be carried out at a temperature of at least 30° C. and up to and including 90° C. for at least 0.25 minute and up to and including 30 minutes.

It can be useful in some embodiments to treat the electrically-conductive article with a hardening bath after fixing and before drying to improve the physical durability of the resulting conductive article. Such hardening baths can include one or more known hardening agents in appropriate amounts that would be readily apparent to one skilled in the art. It can be desired to control the swelling of the conductive film element precursor at one or more stages of processing, so that swelling is limited to a desired amount of the original precursor dry thickness.

An additional treatment such as a stabilizing treatment is also carried out after all of the previously described treatments (such as one or more development steps, fixing, and conductivity enhancing treatment) before a final drying if desired, at any suitable time and temperature.

Drying at any stage can be accomplished in ambient conditions or by heating, for example, in a convection oven at a temperature above 50° C. but below the glass transition temperature of the transparent substrate.

The noted stabilizing treatment can be carried out by contacting or treating the first and additional silver images formed using the processing described above, with a stabilizing solution that can be provided in any suitable manner (by dipping in a bath, spraying, or coating techniques). The noted stabilizing treatment can be carried out at any suitable temperature of at least 20° C. and up to and including 40° C. for a suitable time such as at least 1 second and up to and including 5 minutes.

The stabilizing solution comprises one or more stabilizing agents in an aqueous medium that is generally water, but can also include a suitable surfactant or buffer. The total amount of the stabilizing agents is at least 0.5 mmol/l and up to and including 50 mmol/l, or at least 0.5 mmol/l and up to and including 20 mmol/l, or even at least 1 mmol/l and up to and including 10 mmol/l.

Useful stabilizing agents can be selected from one or more of the following classes of compounds: heterocyclic thiols, benzotriazoles, tetraazoindenes (such as TAI), and purine derivatives (such as hypoxanthine). Mixtures from the same or different classes of compounds can be used if desired. Representative compounds of this type include but are not limited to, 5-methylbenzotriazoles, benzimidazole thiones, benzothiazole thiones, benzoxazole thiones, and thiazoline thiones.

A particularly useful stabilizing agent is N-[3-(2,5-dihydro-5-thioxo-1H-tetrazol-1-yl)phenyl]acetamide.

While imagewise exposing and processing of each side of the precursor can be carried out at different times or sequences, in many embodiments, imagewise exposing and processing of the photosensitive silver halide emulsion layer on the opposing second supporting side of the transparent substrate is carried out simultaneously with imagewise exposing and processing of the photosensitive silver halide emulsion layer on the first supporting side.

The result of the processing steps is an electrically-conductive article as described herein.

For example, the electrically-conductive silver metal electrode grid on the first supporting side and the optional electrically-conductive silver metal grid on the opposing second supporting side can be the same or different in composition, pattern arrangement, conductive line thickness, or shape of the grid lines (for example, a pattern of polygons including but not limited to, a pattern of rectangles, triangles, hexagons, rhombohedrals, octagons, or squares), circles or other curved lines, or random structures, all corresponding to the predetermined pattern in the mask element used during imagewise exposure. For example, in one embodiment, the electrically-conductive silver metal electrode grid on the first supporting side can be arranged in a square pattern, and the electrically-conductive silver metal electrode grid on the opposing supporting second side can be arranged in a diamond pattern. In each instance, the silver grid lines in the electrically-conductive silver metal grids form a net-like structure. In other embodiments, the various patterns on opposing supporting sides can be arranged in an alternative arrangement so that the electrically-conductive silver metal electrode grid on one supporting side only partially covers the electrically-conductive silver metal electrode grid on the opposing supporting side, somewhat as is shown in FIG. 14 of U.S. Patent Application Publication 2011/0289771 (noted above).

The electrically-conductive silver wires in the electrically-conductive silver metal electrode grid can have any desired length that is usually at least 1 cm and up to and including 10 meters, and they can have an average dry thickness (line width, one outer edge to the other outer edge) and dry height that are the same or different, and are generally less than 50 µm, but more likely at least 1 µm and up to and including 20 µm, or particularly at least 5 µm and less than 15 µm or even 10 µm or less.

Each electrically-conductive silver connector wire pattern comprises at least one and more likely at least two adjacent (for example, at least first and second) silver main wires, and there can be up to 1000 or even more of these silver main wires in each electrically-conductive silver connector wire pattern. The number of silver main wires can be different on opposing supporting sides of the transparent substrate. Each silver main wire comprises two or more (and up to 10 or even more) silver micro-wires that are electrically connected to a silver end wire at an end of the at least one (generally at least two adjacent) silver main wires. Thus, the two or more silver micro-wires and the silver end wire in each silver main wire forming a bundled pattern. Many bundled patterns comprise a plurality of silver main wires, each of which comprises a plurality of silver micro-wires and all of the silver micro-wires are electrically connected at both ends to suitable silver end wires. As described below, such bundled patterns can also include one or more silver cross-wires.

In some embodiments, each silver main wire can comprise from two to eight silver micro-wires that with the suitable silver end wires form a bundled pattern. Thus, each bundled pattern in such embodiments comprises a conductive silver end wire at each end of the at least two adjacent silver main wires (and thus at the end of each pair of adjacent silver main wires in the bundled pattern) that electrically connects with the two to eight silver micro-wires in each bundled pattern.

The average distance between any two adjacent silver main wires is greater than the average distance between any two adjacent silver micro-wires in each bundled pattern. For example, the average distance between any two adjacent silver main wires can be greater than the average distance between any two adjacent silver micro-wires in each bundled pattern by at least 30%, or more typically at least 100%. For example, the average distance between two adjacent silver main wires can be at least 5 µm, or at least 10 µm, or even at least 20 µm. Such "average distances" are measured from the outer edge of a given silver micro-wire to the nearest outer edge of an adjacent silver micro-wire, or from the outer edge of the outermost silver micro-wire in a given silver main wire to the outer edge of the closest outermost silver micro-wire in an adjacent silver main wire.

Within each silver main wire, the average total length of each silver micro-wire can be at least 1 mm or typically at least 5 mm and up to and including 1000 mm.

The average distance between any two adjacent silver micro-wires in each bundled pattern (of each and any silver main wire) can be at least 2 µm and up to and including 10 µm (wherein "average distance" is defined above). In particular, the average distance between any two adjacent silver micro-wires in each bundled pattern (or each and any silver main wire) can be at least 5 µm and up to and including 8 µm.

The ratio of the average width (outer edge to opposing outer edge) of each silver micro-wire to the average distance between two adjacent silver micro-wires in each bundled pattern (or each and any silver main wire) can be at least 0.5:1 but less than 2:1, or typically at least 1:1 and up to and including 2:1.

It is also desirable that for each silver micro-wire, the ratio of maximum height to minimum height can be at least 1.05:1, or typically at least 1.1:1.

In some embodiments of at least one of the silver micro-wires (and in most embodiments, each silver micro-wire), the maximum height of the silver micro-wire can be equivalent (varying by less than 10%) to the center height of the silver micro-wire wherein the "center" is determined to be essentially equidistant between the two outer edges of the silver micro-wire. "Essentially equidistant" means that the distances between the two outer edges vary by no more than 10%.

In other embodiments of at least one of the silver micro-wires (and in most embodiments, each silver micro-wire), the maximum height can be closer to a micro-wire outer edge than to micro-wire center height (at least 51% closer to the outer edge than to the center). For example, the maximum height can actually be located at one or both outer edges of some silver micro-wires.

It is also possible that for each silver micro-wire, the ratio of maximum height to average height can be at least 1.01:1, or more typically at least 1.01:1 to and including 1.05:1.

The average width of each silver micro-wire (from one outer edge to the other outer edge) in each bundled pattern can be at least 2 µm and up to and including 20 µm, or typically up to and including 15 µm or typically from 2 µm and up to and including 12 µm.

Moreover, each bundled pattern can comprise at least one silver cross-wire between adjacent silver micro-wires that is not at the end of the adjacent silver micro-wires. Typically, adjacent silver micro-wires comprise multiple silver cross-wires that are not at the end of adjacent silver micro-wires. A skilled worker can design each bundled pattern to have as many silver cross-wires as can be desired for a given electrically-conductive silver connector wire pattern.

The silver cross-wires can be arranged in any suitable frequency or directional arrangement and such arrangement can be the same or different for each set of adjacent silver micro-wires.

For example, each bundled pattern can comprise multiple (two or more) silver cross-wires between adjacent silver micro-wires, wherein the multiple silver cross-wires are arranged at a distance from each other of at least 100 µm.

Moreover, each bundled pattern can comprise multiple (two or more) silver cross-wires in a set of adjacent silver micro-wires that are offset from multiple silver cross-wires in an another set of adjacent silver micro-wires (for example alternating along the adjacent sets of adjacent silver micro-wires). All of the silver cross-wires can therefore be arranged in the same or different manner among all of the adjacent sets of adjacent silver micro-wires.

In some embodiments, each of the multiple silver cross-wires is substantially perpendicular (intersection at an angle of substantially 90°) to the adjacent silver micro-wires. In other embodiments, each of the multiple silver cross-wires intersects the adjacent silver micro-wires at an angle that is greater than or less than 90°. The two or more silver micro-wires can be substantially parallel (for example, the adjacent silver micro-wires are substantially parallel).

Some embodiments of the present invention can also be exemplified in reference to FIGS. 1-11 that are provided in copending U.S. Ser. No. 14/281,925 (noted above), which FIGS. 1-11 are incorporated herein by reference.

The present invention can be carried out using a photosensitive silver halide emulsion layer (from the silver halide emulsion described below) that can be disposed on one or both supporting sides of a transparent poly(ethylene terephthalate) film substrate in any suitable coating manner to form a conductive film element precursor used in the present invention.

The conductive film element precursors can also be prepared using a 100 μm poly(ethylene terephthalate) substrate on which a non-color photosensitive silver halide emulsion can be hardened using BVSM [1,1'-(methylene(sulfonyl)) bis-ethane] and disposed at 0.5 weight % of total gelatin. However, underneath the silver halide emulsion layer, a filter layer can be directly disposed on the transparent substrate for UV absorption, containing 1500 mg/m$^2$ of gelatin and 300 mg/m$^2$ of TINUVIN® 328 UV absorbing dye (for example from BASF).

The non-color photosensitive silver halide emulsion layer can be provided with a silver (Ag) to gelatin weight ratio of 2.33:1 (or at a volume ratio of about 0.233:1). If desired, an outermost hydrophilic overcoat layer can be provided over the non-color photosensitive silver halide emulsion layer, containing 488 mg/m$^2$ of gelatin, 6 mg/m$^2$ of 0.6 μm insoluble polymeric matte particles, and conventional coating surfactants.

This conductive film element precursor can be imagewise exposed on one or both sides using a suitable exposing device through the same or different mask elements that have predetermined reverse images for the eventual desired electrically-conductive silver wire electrode grid and an electrically-conductive silver connector wire pattern on one or both supporting sides of the precursor. Upon exposure of one or both photosensitive silver halide emulsion layers, (a) a latent electrically-conductive silver metal electrode grid, (b) a latent electrically-conductive silver connector wire pattern different from the latent electrically-conductive silver metal electrode grid, and optionally, (c) transparent regions outside of both the latent electrically-conductive silver metal electrode grid and the latent electrically conductive silver connector wire pattern can be formed.

Following imagewise exposure, each latent electrically-conductive silver metal electrode grid and latent electrically-conductive silver connector wire pattern can be processed using at least solution physical development, silver halide fixing, conductivity enhancement (followed by washing and drying), and stabilization treatment, to provide: (a) an electrically-conductive silver metal electrode grid from the latent conductive silver metal electrode grid, (b) an electrically-conductive silver connector wire pattern from the latent electrically-conductive silver connector wire pattern, and (c) transparent regions outside of both the electrically-conductive silver metal electrode grid and the electrically-conductive silver connector wire pattern, in a resulting electrically-conductive article. After fixing and before conductivity enhancement, the processing can include two or more cycles of conductivity enhancement, washing, and drying.

Processing can be carried out using the representative processing solutions described below.

TABLE I

Processing Sequence

| Processing Step/Solution | Processing Temperature (° C.) | Processing Time, (minutes) |
|---|---|---|
| Developing/developer 1 | 40 | 0.5 |
| Washing/rinsing with water | 40 | 1.0 |
| Developing/developer 2 | 40 | 3.0 |
| Fixing/fixing solution | 40 | 1.77 |
| Washing/rinsing with water | 40 | 1.0 |
| Conductivity Enhancement/Conductivity Enhancement Solution | 60 | 2.0 |
| Washing/rinsing with water | 40 | 1.0 |
| Drying | 60 | 15.0 |
| Conductivity Enhancement/Conductivity Enhancement Solution | 60 | 2.0 |
| Washing/rinsing with water | 40 | 1.0 |
| Drying | 60 | 15.0 |
| Conductivity Enhancement/Conductivity Enhancement Solution | 60 | 2.0 |
| Washing/rinsing with water | 40 | 1.0 |
| Drying | 60 | 15.0 |
| Stabilizing/Stabilizer Solution | 40 | 1.0 |
| Washing/rinsing with water | 40 | 1.0 |

The aqueous processing solutions that can be used in the noted processing steps are described below in TABLES II through VI, all of which can be prepared in de-mineralized water. Drying can be carried out using a convection oven.

TABLE II

Developer 1 (Black-and-white developing solution

| Component | Amount (g/liter) |
|---|---|
| Potassium Hydroxide (45.5 wt. %) | 10.83 |
| Sodium Bromide | 5.00 |
| 4,4-Dimethyl-1-phenyl-3-pyrazolidinone | 0.33 |
| 1-Phenyl-5-mercaptotetrazole | 0.13 |
| 5-methylbenzotriazole* | 0.17 |
| Sodium hydroxide (50 wt. %) | 1.82 |
| Phosphonic acid, [nitrilotris(methylene)]tris-, pentasodium salt | 0.29 |
| N,N'-1,2-ethanediylbis(N-(carboxymethyl)glycine, | 1.77 |
| Sodium carbonate monohydrate | 8.33 |
| Potassium Sulfite (45 wt. %) | 83.33 |
| Hydroquinone | 12.50 |
| 5,5'-[Dithiobis(4,1-phenyleneimino)]bis(5-oxo-pentanoic acid | 0.12 |

TABLE III

Developer 2 (Solution physical developing solution)

| Component | Amount (g/liter) |
|---|---|
| Sodium Sulfite | 92.54 |
| Hydroquinone | 4.63 |
| N,N-bis(2-(bis(carboxymethyl)-amino)ethyl)- glycine, pentasodium salt | 0.950 |
| Sodium tetraborate pentahydrate | 2.830 |
| Sodium thiocyanate | 0.42 |

TABLE IV

Fixing Solution

| Component | Amount (g/liter) |
| --- | --- |
| Acetic Acid | 24.43 |
| Sodium hydroxide (50 wt. %) | 10.25 |
| Ammonium thiosulfite | 246.50 |
| Sodium metabisulfite | 15.88 |
| Sodium tetraborate pentahydrate | 11.18 |
| Aluminum sulfate (18.5 wt. %) | 36.26 |

TABLE V

Conductivity Enhancement Solution

| Component | Amount (g/liter) |
| --- | --- |
| [1,2-Bis(3-aminopropylamino)-ethane] | 11.15 |
| Triethanolamine (99 wt. %) | 38.6 |
| Triethanolamine hydrochloride | 14.0 |
| Dimethylaminoborane | 12.0 |
| Sodium lauryl sulfate | 0.030 |
| 2,2-Bipyridine | 1.00 |

TABLE VI

Stabilizer Solution

| Component | Amount (g/liter) |
| --- | --- |
| Sodium hydroxide (50 wt. %) | 0.29 |
| N-[3-(2,5-dihydro-5-thioxo-1H-tetrazol-1-yl)phenyl]acetamide | 0.82 (3.5 mmol/l) |

Other electrically-conductive articles can be similarly prepared from a conductive film element precursor that differs from those described above only in the composition of the hydrophilic overcoat layer that can be as follows:

488 mg/m$^2$ of gelatin, 6 mg/m$^2$ of 0.6 μm insoluble polymeric matte particles, 20 mg/m$^2$ of a silver halide emulsion having a composition of 98 mol % silver chloride and 2 mol % silver iodide (emulsion grains having rounded cubic morphology and an edge length 0.36 μm), 25 mg/m$^2$ of TINUVIN® 328 UV radiation absorber, and conventional surfactants.

The invention has been described in detail with particular reference to certain preferred embodiments thereof, but it will be understood that variations and modifications can be effected within the spirit and scope of the invention.

The invention claimed is:

1. A method for providing a first electrically-conductive silver image, the method comprising, in order:

imagewise exposing a conductive film element precursor that comprises a transparent substrate comprising a first supporting side and an opposing second supporting side and a photosensitive silver halide emulsion layer on the first supporting side of the substrate, to radiation to provide a first latent silver image in the photosensitive silver halide emulsion layer on the first supporting side of the substrate, developing the first latent silver image on at least the first supporting side of the substrate to provide a first silver image corresponding to the first latent silver image on the first supporting side of the substrate, using a black-and-white developing solution, fixing to remove silver halide remaining in the photosensitive silver halide emulsion layer on the first supporting side of the substrate, treating the first silver image on the first supporting side of the substrate to enhance silver conductivity of the first silver image, and treating the first silver image with a stabilizing solution comprising at least 0.5 mmol/l and up to and including 50 mmol/l of a heterocyclic thiol, a benzotriazole, a tetraazoindene, or a purine derivative as a stabilizing agent, to provide an electrically-conductive silver image on the first supporting side of the substrate.

2. The method of claim 1, wherein the stabilizing solution comprises at least 1 mmol/l and up to and including 10 mmol/l of a heterocyclic thiol as a stabilizing agent.

3. The method of claim 1, wherein treating the first silver image to enhance conductivity of the first silver image is carried out using a conductivity enhancing solution comprising at least 0.5 weight % of an amine borane conductivity enhancing agent.

4. The method of claim 1, further comprising, after treating the first silver image to enhance its conductivity and before treating with the stabilizing solution, washing and drying the first silver image.

5. The method of claim 4, wherein the sequence of treating the first silver image to enhance its conductivity, washing and drying the first silver image, is carried out two or more times before treating the first silver image with the stabilizing solution.

6. The method of claim 1, wherein after developing the first latent silver image with the black-and-white developing solution and before fixing, further treating the first latent silver image with a solution physical developing solution.

7. The method of claim 1, wherein the substrate exhibits at least 80% integrated transmittance.

8. The method of claim 1 for providing a second electrically-conductive silver image on the opposing second supporting side of the substrate that exhibits at least 80% integrated transmittance, wherein the conductive film element precursor further comprises a photosensitive silver halide emulsion layer disposed on the opposing second supporting side of the substrate, and the method further comprises:

imagewise exposing the photosensitive silver halide emulsion layer on the opposing second supporting side of the substrate to radiation to provide a second latent silver image in the photosensitive silver halide emulsion layer on the opposing second supporting side of the substrate, developing the second latent silver image on the opposing second supporting side to provide a second silver image corresponding to the second latent silver image on the opposing second supporting side of the substrate, using a black-and-white developing solution, fixing to remove silver halide remaining in the second photosensitive silver halide emulsion layer on the opposing second supporting side of the substrate, treating the second silver image on the opposing second supporting side of the substrate to enhance silver conductivity of the second silver image, and treating the first silver image with a stabilizing solution comprising at least 0.5 mmol/l and up to and including 50 mmol/l weight % of a heterocyclic thiol, a benzotriazole, a tetraazoindene, or a purine derivative as a stabilizing agent, to provide a second electrically-conductive silver image on the opposing second supporting side of the substrate.

9. The method of claim 8, wherein forming the first electrically-conductive silver image and the second electrically-conductive silver image by imagewise exposing and processing of the respective photosensitive silver halide emulsion layers are carried out simultaneously using the same processing solutions.

10. The method of claim 9, wherein the sequence of treating the first silver image and the second silver image to enhance their conductivity, washing, and drying the first silver image and the second silver image, is carried out two or more times before treating the first silver image and the second silver image with the stabilizing solution.

11. The method of claim 8, wherein after developing the second latent silver image with the black-and-white developing solution and before fixing, further treating the second latent silver image with a solution physical developing solution.

12. The method of claim 1, wherein the conductive film element precursor comprises a transparent polyester substrate and has on the first supporting side thereof, in order, the photosensitive silver halide emulsion layer comprising silver ions and at least one hydrophilic binder in a weight ratio of at least 2:1 and up to and including 5:1, and a hydrophilic overcoat as the outermost layer, which hydrophilic overcoat comprising one or more hydrophilic binders and optionally at least 5 mg Ag/m$^2$ and up to and including 75 mg Ag/m$^2$ from silver halide.

13. The method of claim 12, wherein the hydrophilic overcoat further comprises one or more UV radiation absorbers in an amount of at least 5 mg/m$^2$ and up to and including 100 mg/m$^2$.

14. The method of claim 12, wherein the hydrophilic overcoat comprises at least 5 mg Ag/m$^2$ and the silver halide grain ECD to dry thickness ratio is from 0.5:1 to and including 1.25:1.

15. The method of claim 1, wherein the photosensitive silver halide emulsion layer has a swell ratio of at least 150% and up to and including 300%.

16. The method of claim 8, wherein the conductive film element precursor comprises a transparent polyester substrate and has on the first supporting side thereof, in order, the photosensitive silver halide emulsion layer comprising silver ions and at least one hydrophilic binder in a weight ratio of at least 2:1 and up to and including 5:1, and a hydrophilic overcoat as the outermost layer, which hydrophilic overcoat comprising one or more hydrophilic binders and optionally at least 5 mg Ag/m$^2$ and up to and including 75 mg Ag/m$^2$ from silver halide, and the conductive film element precursor has on the opposing second supporting side of the transparent polyester substrate, in order, a photosensitive silver halide emulsion layer comprising silver ions and at least one hydrophilic binder in a weight ratio of at least 2:1 and up to and including 5:1, and a hydrophilic overcoat as the outermost layer, which hydrophilic overcoat comprising one or more hydrophilic binders and optionally at least 5 mg Ag/m$^2$ and up to and including 75 mg Ag/m$^2$ from silver halide.

* * * * *